United States Patent
Lee et al.

(10) Patent No.: US 6,752,869 B2
(45) Date of Patent: Jun. 22, 2004

(54) ATOMIC LAYER DEPOSITION USING ORGANOMETALLIC COMPLEX WITH β-DIKETONE LIGAND

(75) Inventors: Jung-hyun Lee, Yongin (KR); Dae-sig Kim, Seongnam (KR); Yo-sep Min, Seoul (KR); Young-jin Cho, Incheon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 31 days.

(21) Appl. No.: 10/160,111

(22) Filed: Jun. 4, 2002

(65) Prior Publication Data
US 2003/0008072 A1 Jan. 9, 2003

(30) Foreign Application Priority Data
Jun. 14, 2001 (KR) ........................................ 2001-33532

(51) Int. Cl.[7] .............................................. C30B 25/04
(52) U.S. Cl. ........................ 117/104; 117/84; 427/255.2
(58) Field of Search ......................... 427/255.2; 117/84, 117/104

(56) References Cited

U.S. PATENT DOCUMENTS 5,355,212 A * 10/1994 Wells et al. ................. 356/237
6,175,645 B1 * 1/2001 Elyasaf et al. .............. 382/147

FOREIGN PATENT DOCUMENTS

KR      2000-39578      7/2000
WO     WO 00/34549     6/2000

* cited by examiner

Primary Examiner—Felisa Hiteshew
(74) Attorney, Agent, or Firm—Lee & Sterba, P.C.

(57) ABSTRACT

An atomic layer deposition (ALD) method, whereby an organometallic complex with a β-diketone ligand is chemically adsorbed onto a substrate and oxidized by activated oxygen radicals to deposit an atomic metal oxide layer on the substrate, uses reactive oxygen radicals generated using plasma and an organometallic complex having a β-diketone ligand as a precursor, which could not be used in a thermal ALD method using oxygen or water as an oxidizing agent, to address and solve the problem of the removal of organic substances using organometallic complexes with β-diketone ligands, thereby enabling diversification of the precursors for ALD and formation of excellent oxide films at low temperatures.

6 Claims, 8 Drawing Sheets

ATOMIC LAYER DEPOSITION USING ORGANOMETALLIC COMPLEX WITH β-DIKETONE LIGAND

BACKGROUND OF THE INVENTION

1. Field of the Invention

The present invention relates to an atomic layer deposition (ALD) method using an organometallic complex with a β-diketone ligand and, more particularly, to an improved ALD method in which chemical species with β-diketone ligands are deposited into atomic layers using activated oxygen radicals using plasma as an energy source.

2. Description of the Related Art

Metal oxide thin films, which are used as high-dielectric thin films, ferroelectric thin films, and electrodes, are generally formed by a sputtering, sol-gel, chemical vapor deposition (CVD), or atomic layer deposition (ALD) method.

In the ALD method, a volatile organometallic compound as a precursor is chemically adsorbed onto a substrate and oxidized to form a desired metal oxide thin film. The ALD method has recently gained great interest because thin film formation by chemical adsorption improves large-area surface uniformity and step coverage with easy control of the metal composition.

To form a metal oxide thin film by the ALD method described above, there is a need for a precursor that is capable of easy chemical adsorption onto a target substrate, having excellent thermal and chemical stability and vaporization characteristics, and a great difference between its vaporization and decomposition temperatures. It is also necessary to create oxidation conditions for rapid oxidation of the chemically adsorbed precursor. In addition, an oxidizing agent such as oxygen and water is required to achieve a high oxidation rate.

Compounds with alkyl or aromatic ligands that are highly decomposable in an oxidation atmosphere have been widely used as the precursor.

For a metal compound having molecular bonds with a low coordination number, alkyl or aromatic ligands bonded to metal atoms by comparatively weak bond strength are enough to ensure high volatility at low temperatures. In addition, because the bonds between the metal atoms and the ligands are easily broken, such a metal compound is very suitable for use as an ALD precursor with high oxidation rate.

When metal atoms, such as barium (Ba) and strontium (Sr), having large bonding volume and large coordination numbers, are coordinated with alkyl or aromatic ligands, a large-weight molecule is formed through bonding of a unit molecule consisting of the metal atom and ligands such as alkyl or aromatic ligands, with reduced volatility. When such a compound having alkyl or aromatic ligands is used as a precursor, high-temperature heating is necessary to increase the vapor pressure of the precursor. However, weak bonds between the metal and ligands are dissociated during the heating process so that use of the precursor is limited. To solve this problem, β-diketone, such as tetramethylheptanedionate (tmhd), having a large volume, has been suggested as a ligand coordinated to a metal atom to prevent bonding of the unit molecule.

However, use of a compound having β-diketone ligands for thermal ALD using oxygen has been limited due to low oxidation rates. For this reason, a precursor with alkyl or aromatic ligands that have poor volatility but is easily oxidized has been mostly used for the ALD. In other words, increasing volatility of the precursor for use in ALD has been unchallenged at the cost of increasing its oxidation rate.

SUMMARY OF THE INVENTION

A feature of the present invention is to provide an atomic layer deposition (ALD) method with a high oxidation rate using a highly volatile compound with a β-diketone ligand strongly bonded to metal as a precursor.

According to a preferred embodiment of the present invention, there is provided an atomic layer deposition (ALD) method comprising chemically adsorbing an organometallic complex with a β-diketone ligand onto a substrate and oxidizing the chemically adsorbed organometallic complex using activated oxygen radicals in order to deposit an atomic metal oxide layer on the substrate.

The activated oxygen radicals are generated by reacting plasma as an energy source with at least one oxygen-containing gas selected from the group consisting of oxygen, ozone, nitrogen monoxide, and water vapor. Additionally, the oxygen containing gas may be irradiated with ultraviolet (UV) light during reaction with the plasma to generate the activated oxygen radicals.

The organometallic complex with a β-diketone ligand is expressed by formula (1) below:

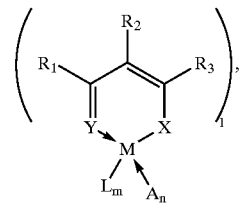

(1)

where M is a metal ion with a valence number of 1 to 6; X is O, NH, or S; Y is O, N, or S; and $R_1$, $R_2$, and $R_3$ are independently a hydrogen atom, a linear or branched unsubstituted alkyl group having 2 to 10 carbon atoms, a linear or branched alkoxy group-substituted alkyl group having 2 to 10 carbon atoms, a linear or branched alkoxyalkyleneoxy group-substituted alkyl group having 2 to 10 carbon atoms, or an alkylamine group having 2 to 10 carbon atoms; I is 1 or 2; L is an anionic ligand coordinated to metal M; m is an integer from 0 to 5; A is a neutral ligand; and n is an integer from 0 to 4.

Preferably, in formula (1) above, L is an alkoxy group having 1 to 10 carbon atoms, an alkyl group having 1 to 5 carbon atoms or an alkylamine or alkylsulfide group having 1 to 10 carbon atoms, and A is ether or amine with a coordination number by which all coordination locations of the cationic metal are saturated.

These and other features and aspects of the present invention will be readily apparent to those of ordinary skill in the art upon review of the detailed description that follows.

BRIEF DESCRIPTION OF THE DRAWINGS

The above features and advantages of the present invention will become more apparent by describing in detail preferred embodiments thereof with reference to the attached drawings in which.

DETAILED DESCRIPTION OF THE INVENTION

Figure 1:
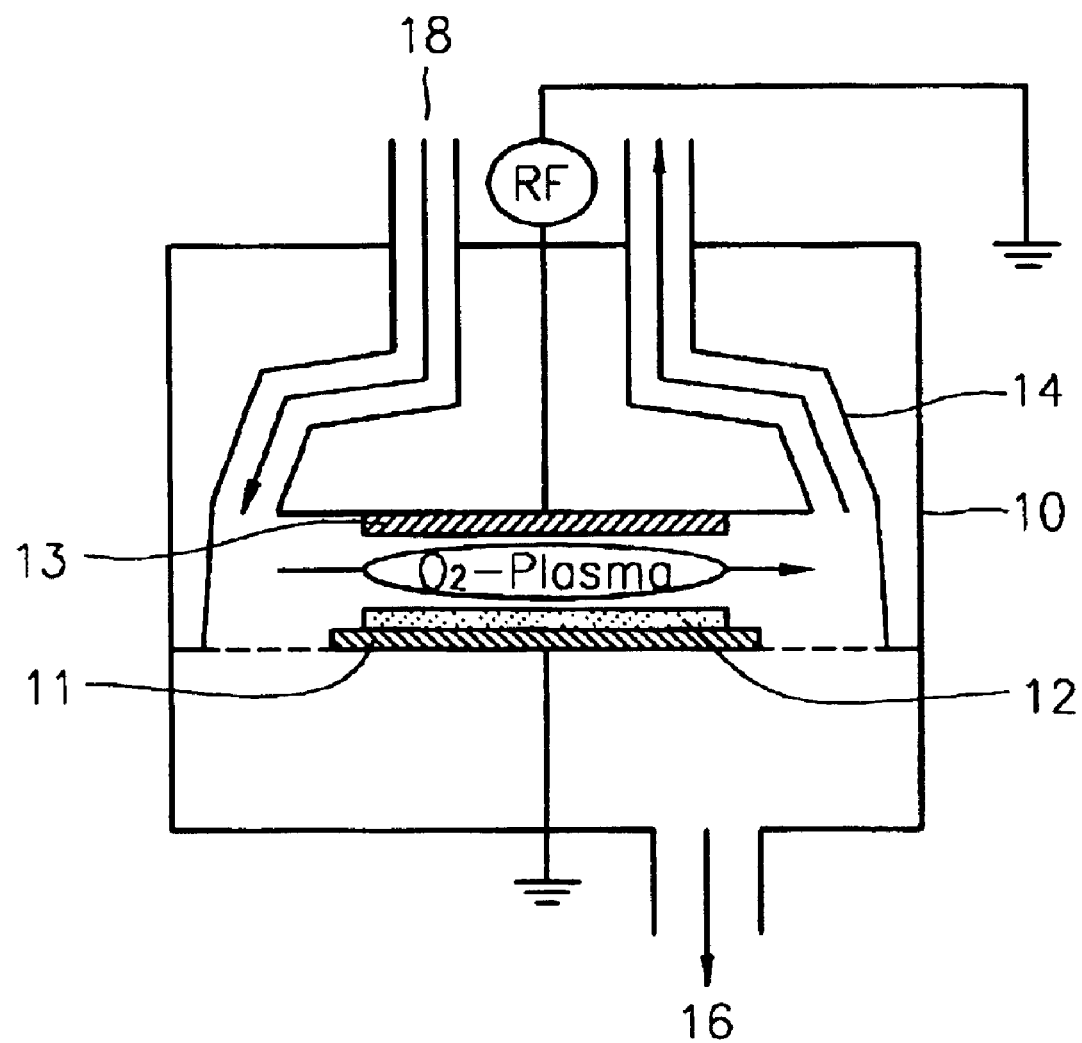
FIG. 1 is a schematic diagram of a plasma generating reactor used in the present invention.

Korean Patent Application No. 2001-33532, filed on Jun. 14, 2001, and entitled: "Atomic Layer Deposition Using Organometallic Complex β-diketone Ligand," is incorporated by reference herein in its entirety.

The present invention provides an atomic layer deposition (ALD) method in which a precursor with a β-diketone ligand, which shows a slow oxidation rate in a conventional thermal ALD method of using oxygen, is oxidized at a high rate by generation of highly reactive oxygen radicals using plasma as an energy source. Also, the problem of poor volatility of precursors with alkyl or aromatic ligands can be solved using a precursor with a β-diketone ligand. According to the method of the present invention, the amount of the precursor supplied per unit time is markedly increased with high chemical adsorption rate and large-area film uniformity. A high-quality oxide film in which no residual carbon exists can be formed using plasma.

An organometallic complex with a β-diketone ligand, which is used as a precursor in the ALD method according to the present invention, has two carbonyl groups in the molecule, as expressed in formula (1) below,

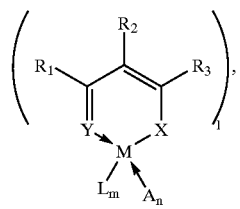

(1)

where M is a metal ion with a valence number of 1 to 6; X is O, NH, or S; Y is O, N, or S; and $R_1$, $R_2$, and $R_3$ are independently a hydrogen atom, a linear or branched unsubstituted alkyl group having 2 to 10 carbon atoms, a linear or branched alkoxy group-substituted alkyl group having 2 to 10 carbon atoms, a linear or branched alkoxyalkyleneoxy group-substituted alkyl group having 2 to 10 carbon atoms, or an alkylamine group having 2 to 10 carbon atoms; I is 1 or 2; L is an anionic ligand coordinated to metal M; m is an integer from 0 to 5; A is a neutral ligand; and n is an integer from 0 to 4.

For $R_1$, $R_2$, and $R_3$ in formula (1), suitable linear alkyl groups having 2 to 10 carbon atoms include methyl, ethyl, propyl, and butyl. Suitable branched alkyl groups having 2 to 10 carbon atoms include tert-butyl and isopropyl. Suitable linear alkoxy-substituted alkyl groups having 2 to 10 carbon atoms include methoxy, ethoxy, and butoxy. Suitable branched alkoxy-substituted alkyl groups having 2 to 10 carbon atoms include $—C(CH_3)_2—OCH_3$. Suitable linear alkoxyalkyleneoxy-substituted alkyl groups having 2 to 10 carbon atoms include $—CH_2—O—CH_2\text{-}OCH_3$ and $—CH_2—O—CH_2CH_2—OCH_3$. Suitable branched alkoxyalkyleneoxy-substituted alkyl groups having 2 to 10 carbon atoms include $—C(CH_3)_2—CH_2—O—CH_2CH_2—OCH_3$, $—C(CH_3)_2—O—CH_2—OCH_3$. Suitable alkylamine groups having 2 to 10 carbon atoms include pyridine, $—NH—CH_2CH_2—NH—$, and $—N(CH_3)—CH_2CH_2—N(CH_3)—$.

In formula (1) above, L includes tetramethylheptanedionate (tmhd), and A includes tetraglyme and pentamethyldiethylenetriamine (PMDT).

Preferably, the organometallic complex of formula (1) above with a β-diketone ligand is $Ba(tmhd)_2$ of formula (2), $Sr(tmhd)_2$ of formula (3), $TiO(tmhd)_2$ of formula (4), $Ba(tmhd)_2(tetraglyme)$ of formula (5), $Sr(tmhd)_2$ (tetraglyme) of formula (6), $Ti(iOPr)_2(tmhd)_2$ of formula (7), $Ba(metmhd)_2$ of formula (8), $Sr(metmhd)_2$ of formula (9), $Sr(mthd)_2$ of formula (10), $Ti(dmpd)(tmhd)_2$ of formula (11), $Ti(depd)(tmhd)_2$ of formula (12), or $Ba(mthd)_2$ of formula (13). In the above formulas, the abbreviation "i-OPr" stands for isopropoxide, "mthd" stands for methoxytetraethylheptanedionate, "metmhd" stands for methoxyethoxytetramethylheptanedionate, "dmpd" stands for dimethylpentadiol, and "depd" stands for diethylpentadiol.

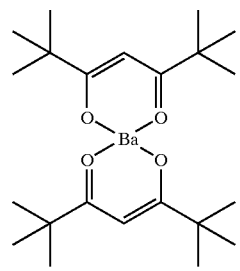

(2)

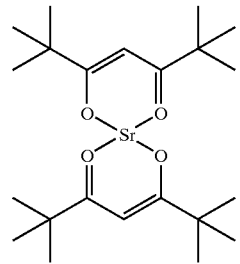

(3)

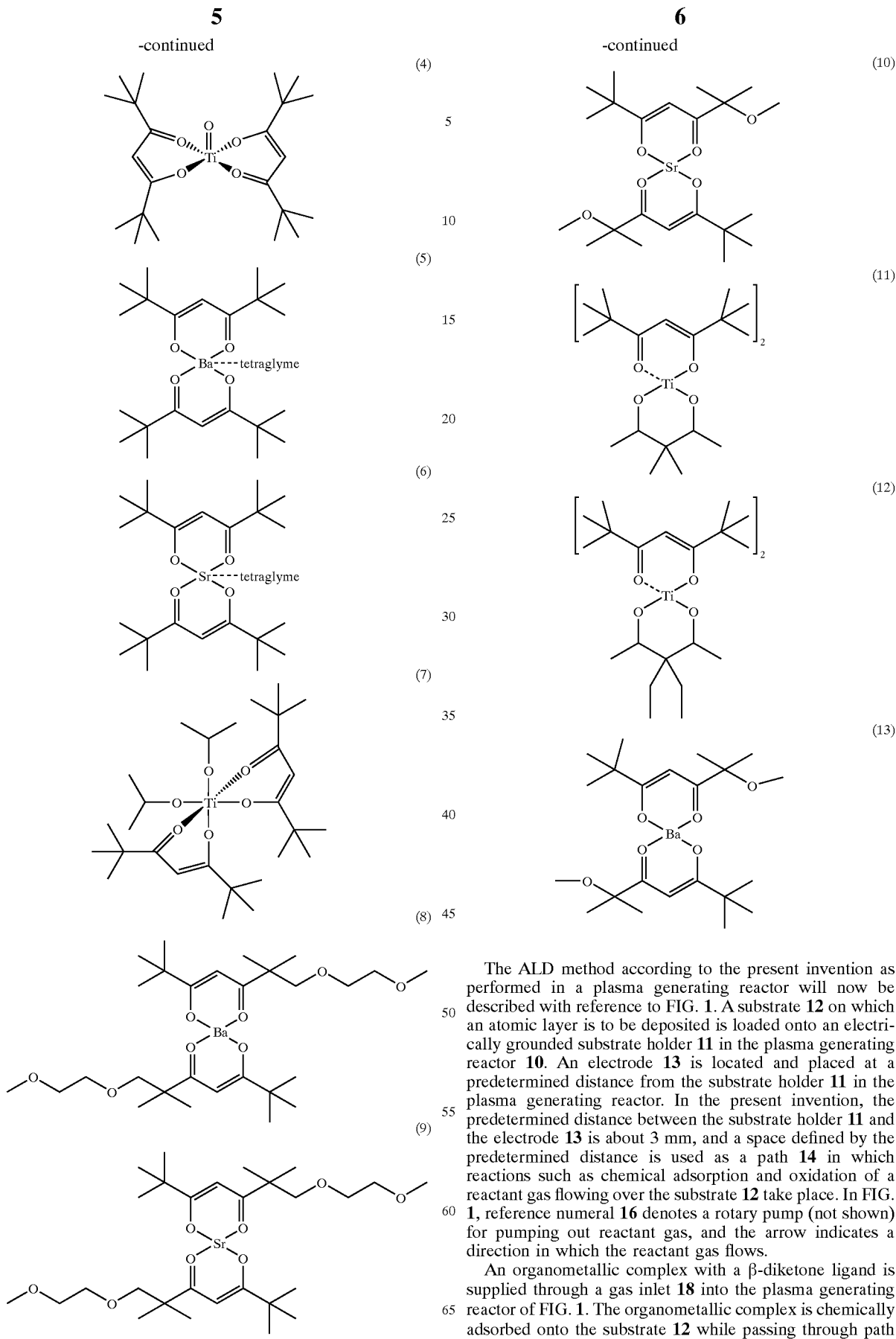

The ALD method according to the present invention as performed in a plasma generating reactor will now be described with reference to FIG. 1. A substrate 12 on which an atomic layer is to be deposited is loaded onto an electrically grounded substrate holder 11 in the plasma generating reactor 10. An electrode 13 is located and placed at a predetermined distance from the substrate holder 11 in the plasma generating reactor. In the present invention, the predetermined distance between the substrate holder 11 and the electrode 13 is about 3 mm, and a space defined by the predetermined distance is used as a path 14 in which reactions such as chemical adsorption and oxidation of a reactant gas flowing over the substrate 12 take place. In FIG. 1, reference numeral 16 denotes a rotary pump (not shown) for pumping out reactant gas, and the arrow indicates a direction in which the reactant gas flows.

An organometallic complex with a β-diketone ligand is supplied through a gas inlet 18 into the plasma generating reactor of FIG. 1. The organometallic complex is chemically adsorbed onto the substrate 12 while passing through path 14. The organometallic complex may be supplied together with a solvent such as n-butylacetate, tetrahydrofuran, and pyridine. The flow rate of the precursor can be easily controlled by supplying a precursor solution prepared using such a solvent.

An inert gas as a carrier gas and an oxygen-containing gas are then supplied through the gas inlet 18, and plasma is generated by the application of power to electrode 13. Activated oxygen radicals are generated by reaction between the generated plasma and the oxygen-containing gas, and the organometallic complex with a β-diketone ligand chemically adsorbed onto the substrate 12 is oxidized by the activated oxygen radicals. An atomic metal oxide layer corresponding to the organometallic complex is thereby formed on the substrate 12.

The inert gas may be nitrogen or argon. The oxygen-containing gas may be oxygen, nitrogen oxide (NO), ozone, or water vapor. Generation of the activated oxygen radicals may be facilitated by UV radiation on the oxygen-containing gas reacting with the plasma. The organometallic complex with a β-diketone ligand may be selected from any one of the compounds having formula (2) through (10).

The oxidation process in the plasma generating reactor 10 is carried out under the conditions of a substrate temperature of 220–400° C., a reactor pressure of 0.1–6 torr, an oxygen-containing gas flow rate of 10–500 sccm, and a plasma source power of 50–300W. If the substrate temperature is less than 220° C., physical adsorption rather than chemical adsorption is dominant. If the substrate temperature exceeds 400° C., the precursor is decomposed so that it is difficult to remove the physically adsorbed precursor particles in a later process. If the reactor pressure is less than 0.1 torr or exceeds 6 torr, it is difficult to generate plasma. If the oxygen-containing gas flow rate is less than 10 sccm, the amount of the oxygen-containing gas as an oxidizing agent is absolutely insufficient. If the oxygen-containing gas flow rate exceeds 500 sccm, a purging period following the oxidation process must be extended due to the presence of residual oxidizing agents in the reactor. If the plasma source power is less than 50W, it is difficult to generate oxygen radicals. If the plasma source power exceeds 300W, the resulting atomic layer can be damaged by ion bombardment.

The present invention will be described in greater detail by means of the following examples. The following examples are for illustrative purposes and are not intended to limit the scope of the invention.

EXAMPLE 1

0.2M $Sr(tmhd)_2$ having formula (3) was dissolved in n-butylacetate and then supplied into the plasma generating reactor shown in FIG. 1. Plasma was generated under the following conditions to deposit an atomic layer on a substrate through oxidation reactions induced by activated oxygen radicals: a substrate temperature of about 250° C., a reactor pressure of about 3 torr, an oxygen flow rate of about 100 sccm, and a plasma source power of about 180 W.

EXAMPLE 2

An atomic layer was deposited on a substrate in the same manner as in Example 1, except that $Ti(O)(tmhd)_2$ having formula (4) was used instead of $Sr(tmhd)_2$ having formula (3).

EXAMPLE 3

An atomic layer was deposited on a substrate in the same manner as in Example 1, except that $Ti(i-OPr)_2(tmhd)_2$ having formula (6) was used instead of $Sr(tmhd)_2$ having formula (3).

EXAMPLE 4

An atomic layer was deposited on a substrate in the same manner as in Example 1, except that $Ti(dmpd)(tmhd)_2$ having formula (11) and nitrogen oxide were used instead of $Sr(tmhd)_2$ having formula (3) and oxygen, respectively.

EXAMPLE 5

An atomic layer was deposited on a substrate in the same manner as in Example 1, except that $Ti(depd)(tmhd)_2$ having formula (12) and water vapor were used instead of $Sr(tmhd)_2$ having formula (3) and oxygen, respectively.

EXAMPLE 6

An atomic layer was deposited on a substrate in the same manner as in Example 1, except that $Ba(tmhd)_2$ having formula (2) and ozone were used instead of $Sr(tmhd)_2$ having formula (3) and oxygen, respectively.

EXAMPLE 7

An atomic layer was deposited on a substrate in the same manner as in Example 1, except that $Sr(mthd)_2$ having formula (10) and nitrogen oxide were used instead of $Sr(tmhd)_2$ having formula (3) and oxygen, respectively.

EXAMPLE 8

An atomic layer was deposited on a substrate in the same manner as in Example 1, except that $Ba(mthd)_2$ having formula (13) and nitrogen oxide were used instead of $Sr(tmhd)_2$ having formula (3) and oxygen, respectively.

COMPARATIVE EXAMPLE 1

An atomic layer was deposited on a substrate using $Sr(tmhd)_2$ having formula (3) as a precursor by the conventional thermal ALD using oxygen gas.

COMPARATIVE EXAMPLE 2

An atomic layer was deposited on a substrate in the same manner as in Comparative Example 1, except that $Ti(O)(tmhd)_2$ having formula (4) was used instead of $Sr(tmhd)_2$ having formula (3).

The state of the atomic layers formed in Examples 1 and 2 was observed using an electron scanning microscope. The results are shown in FIGS. 2 and 3.

Figure 2:
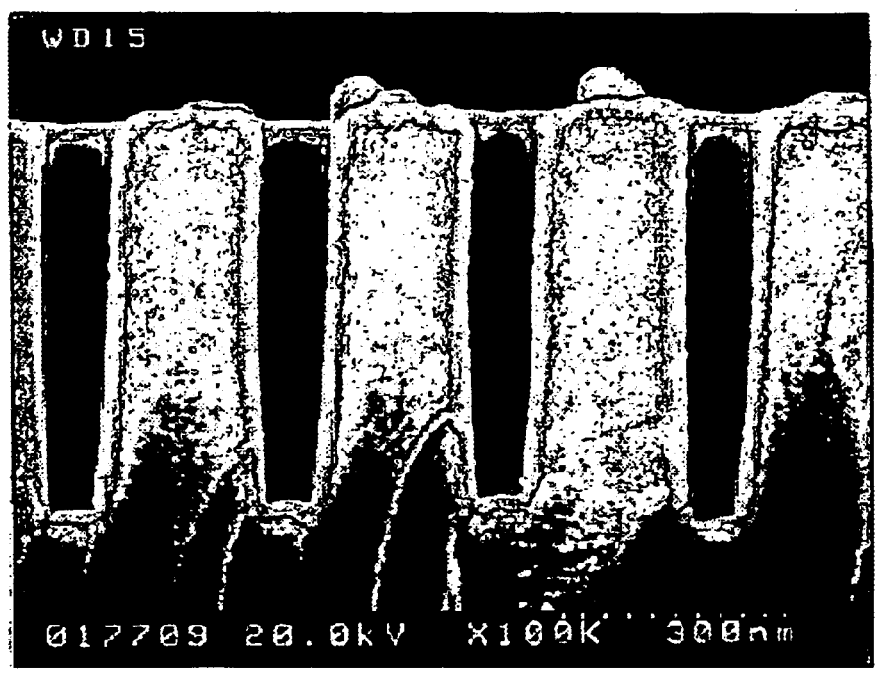
FIG. 2 is a scanning electron microscopic (SEM) photograph (×100,000) of an atomic layer formed in accordance with Embodiment 1 of the present invention.
Figure 3:
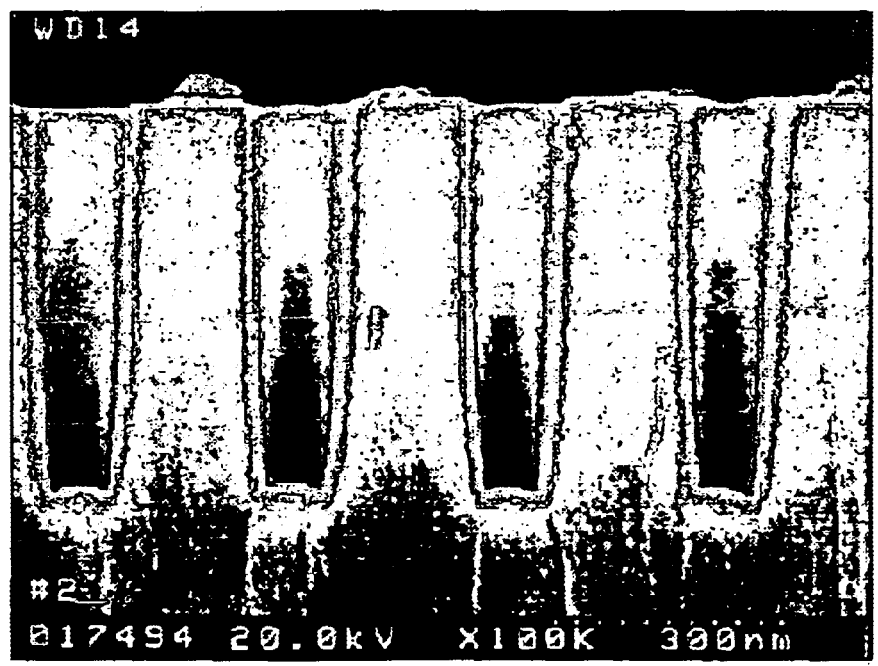
FIG. 3 is an SEM photograph (×100,000) of an atomic layer formed in accordance with Embodiment 2 of the present invention.

As show in FIGS. 2 and 3, which are 100,000×-magnified SEM photographs, excellent step coverage of 90% or greater was achieved by the atomic layers formed in Examples 1 and 2.

To verify the effect of reactive oxygen radicals produced using plasma, the atomic layers formed of $Sr(tmhd)_2$ and $TiO(tmhd)_2$ in Examples 1 and 2, respectively, were examined using infrared spectroscopy. The results are shown in FIGS. 4 and 5.

Figure 4:
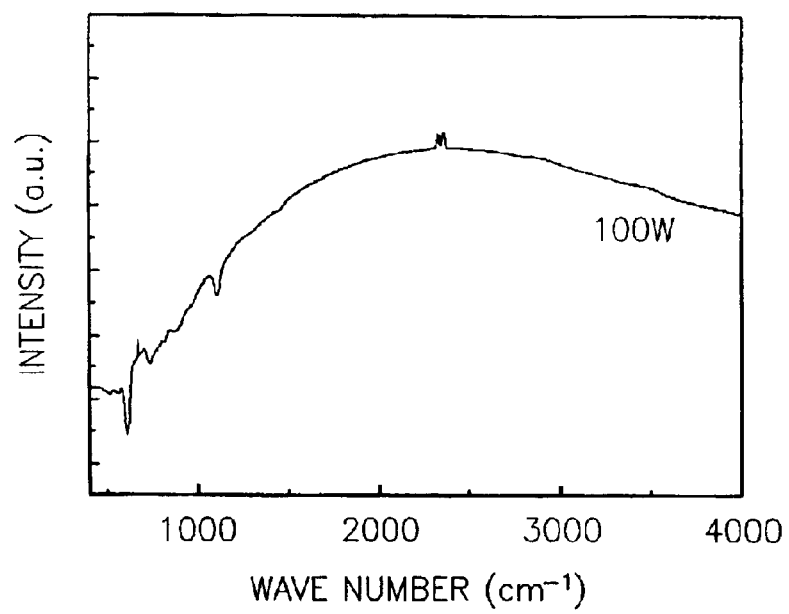
FIG. 4 is a graph illustrating an the infrared spectra of the atomic layer formed in accordance with Example 1 of the present invention.
Figure 5:
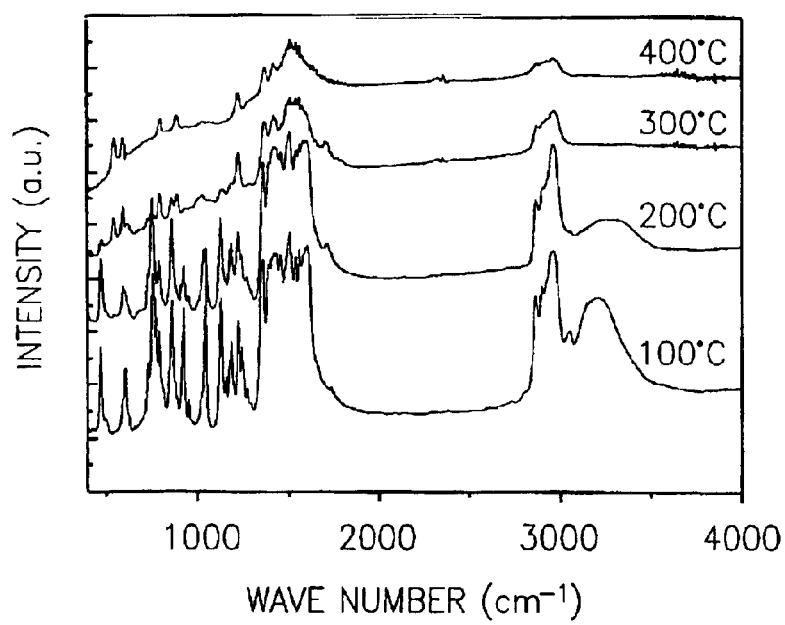
FIG. 5 is a graph illustrating an infrared spectra of $TiO(tmhd)_2$ used as a precursor in Embodiment 2 where the abbreviation "tmhd" stands for tetramethylheptanedionate.

As shown in FIG. 4, no organic contaminant remained in the atomic layer formed in Example 1. From the infrared spectra shown in FIG. 5, it is evident that the oxidation of the carbonyl group, which is known to be observed at wave numbers from 1600 $cm^{-1}$ to 1700 $cm^{-1}$, is most slow in the atomic layer formed in Example 2.

Figure 6A:
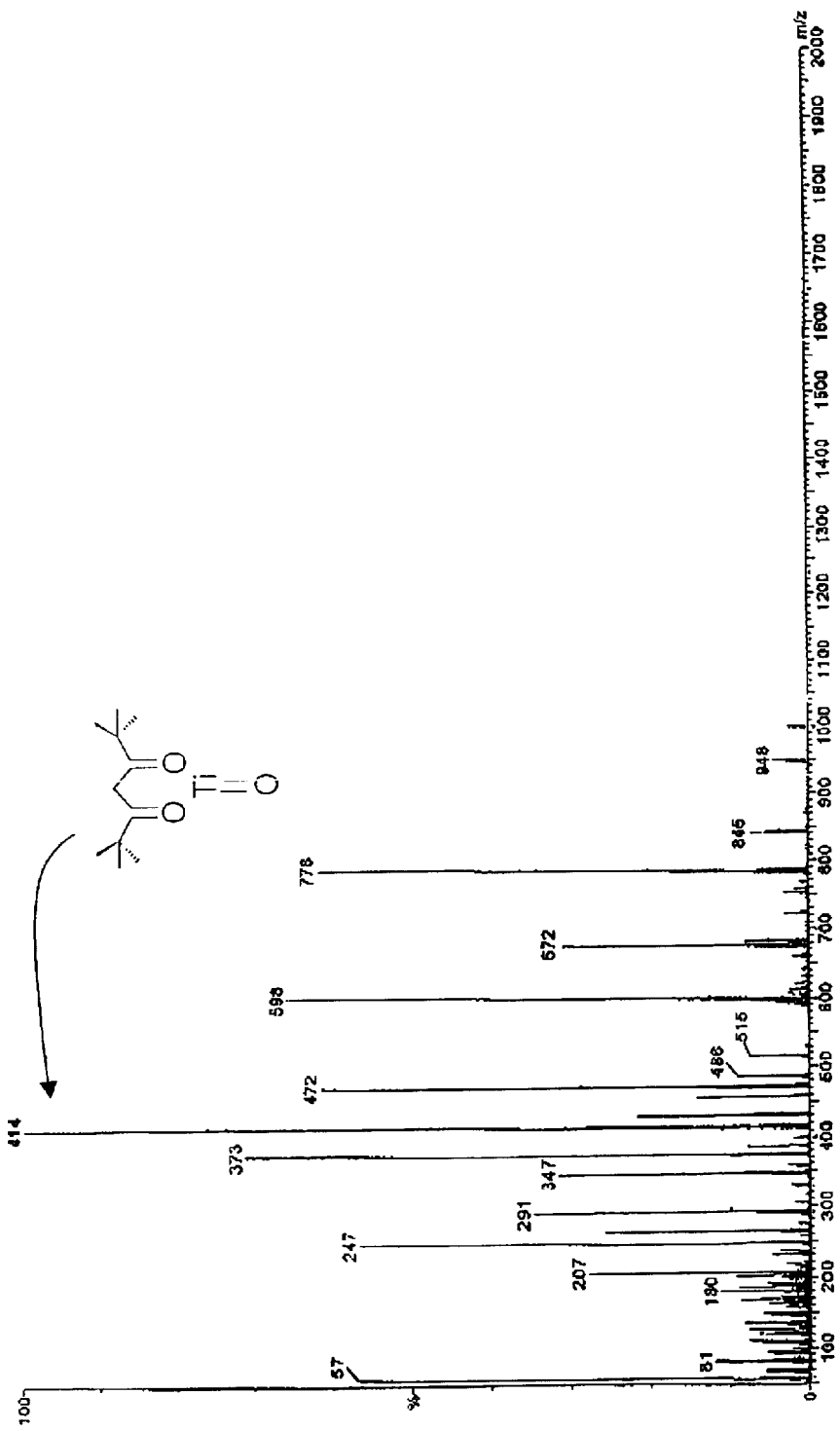
FIGS. 6A through 6C are graphs showing the mass spectra of the organometallic complexes, $Ti(i-OPr)_2(tmhd)_2$, $Ti(dmpd)(tmhd)_2$, and $Ti(depd)(tmhd)_2$, used in Examples 3 and 5 according to the present invention where "-OPr" represents isopropoxide "dmpd" represents dimethylpentadiol, and "depd" represents diethylpentadiol.
Figure 6B:
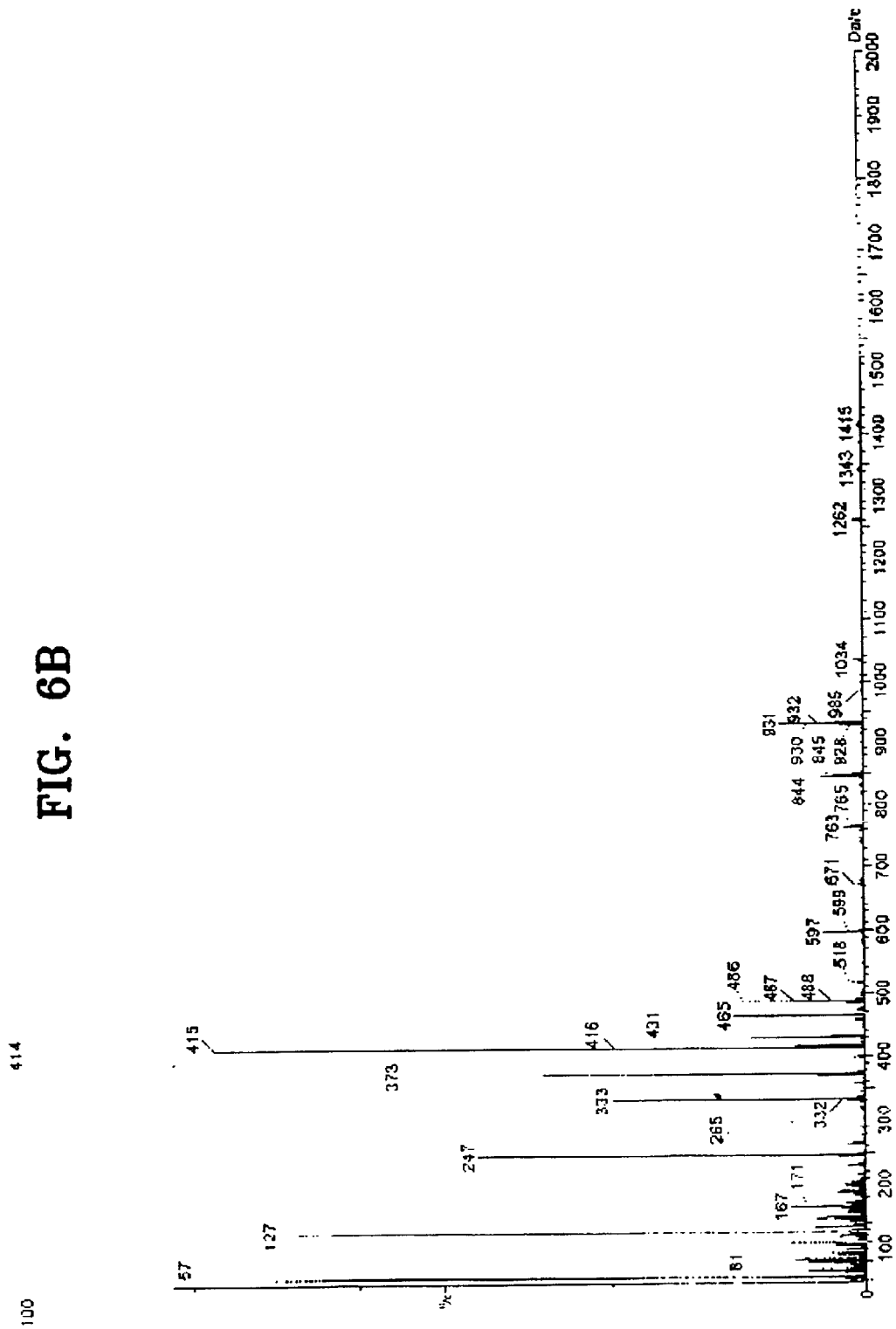
Figure 6C:
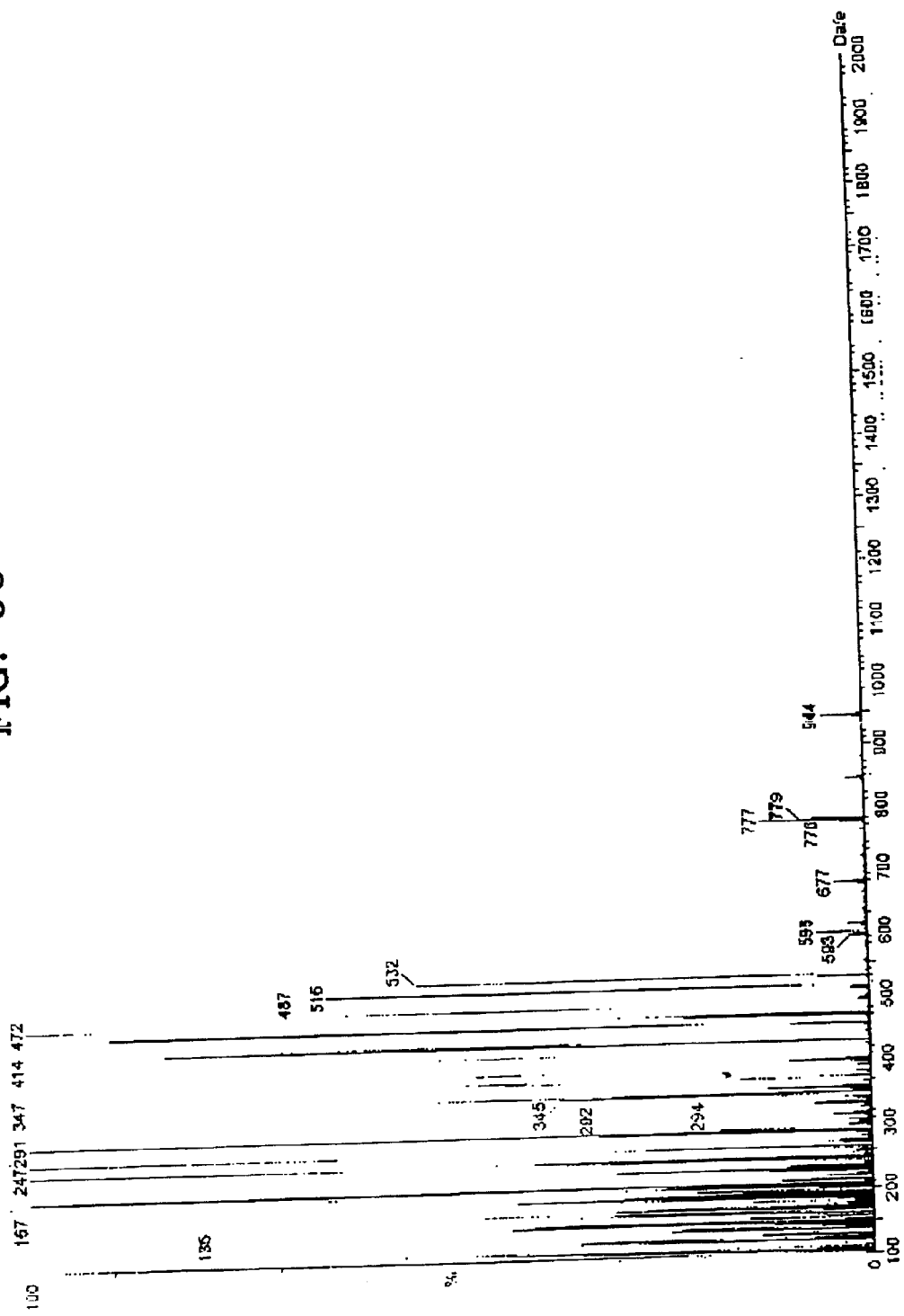

The decomposition characteristics of the ligands in the organometallic complexes $Ti(i-OPr)_2(tmhd)_2$, $Ti(dmpd)(tmhd)_2$, and $Ti(depd)(tmhd)_2$ used in Examples 3 through 5 were determined by mass spectrometry. The results are shown in FIGS. 6A through 6C. FIGS. 6A through 6C show that Ti(i-OPr)$_2$(tmhd)$_2$, Ti(dmpd)(tmhd)$_2$, and Ti(depd)(tmhd)$_2$ are changed to Ti(O)(tmhd)$_2$ at a temperature above 200° C.

Figure 7:
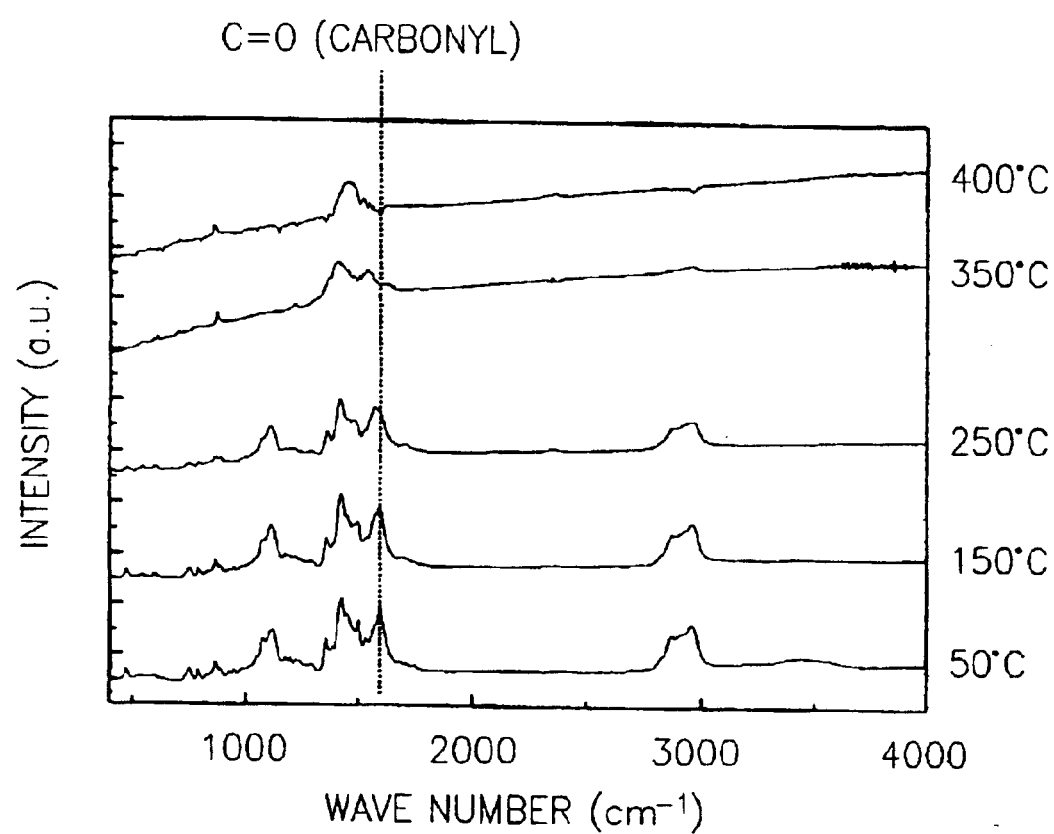
FIG. 7 is a graph showing the infrared spectra of the organometallic complexes, $Sr(tmhd)_2$ and $Ba(tmhd)_2$, used in Examples 1 and 6 according to the present invention.

The decomposition characteristics were determined for the organometallic complexes Sr(tmhd)$_2$ and Ba(tmhd)$_2$ used in Examples 1 and 6, respectively, using infrared spectroscopy. The results are shown FIG. 7. As shown in FIG. 7, the oxidation of the carbonyl group, which is known to be observed at wave numbers from 1600 cm$^{-1}$ to 1700 cm$^{-1}$, is most slow in the atomic layers formed in Examples 1 and 6.

Figure 8:
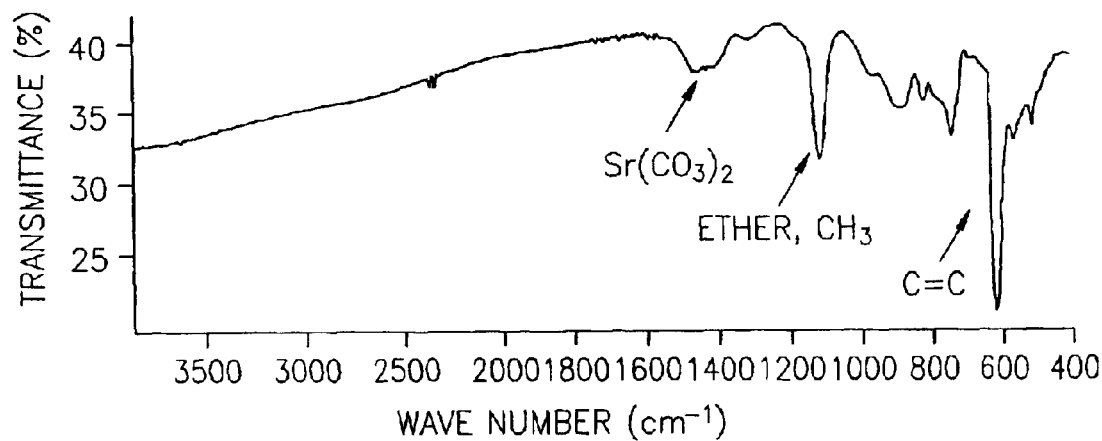
FIG. 8 is a graph showing the infrared spectra of the organometallic complexes, $Sr(tmhd)_2$ and $Ba(tmhd)_2$, used in Examples 7 and 8 according to the present invention.

The decomposition characteristics were determined for the organometallic complexes Sr(mthd)$_2$ and Ba(mthd)$_2$ used in Examples 7 and 8, respectively, using infrared spectroscopy. The results are shown FIG. 8. As shown in FIG. 8, as with "tmhd" ligands, the oxidation of the carbonyl group in "mthd" ligands is most slow.

Figure 9:
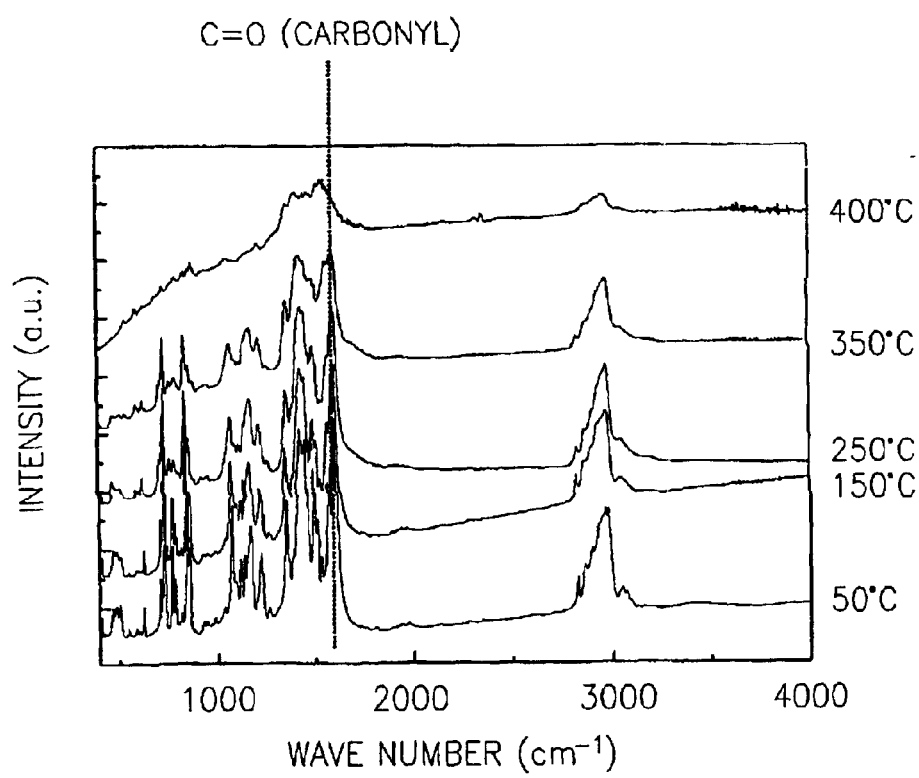
FIG. 9 is a graph showing the infrared spectra of the organometallic complex $Sr(tmhd)_2$ used in Comparative Example 1.

When the conventional thermal ALD method using oxygen gas is carried out, an atomic layer was not formed. Chemical changes in the precursor were determined using infrared spectroscopy while raising the temperature of a small reactor made of quartz and KBr and containing Sr(tmhd)$_2$ of formula (3) above with the supply of oxygen gas, wherein the small reactor was placed in a sample holder of an infrared spectrometer. FIG. 9 shows the infrared spectra of Sr(tmhd)$_2$ used in Comparative Example 1 by the conventional thermal ALD process under the same conditions as in the plasma ALD process according to the present invention.

Referring to FIG. 9, the tert-butyl group of Sr(tmhd)$_2$ was easily decomposed at a temperature lower than 350° C., but the dicarbonyl group was virtually unaffected and rarely oxidized, and resulted in a large amount of residual carbon.

According to Comparative Example 2 in which the conventional thermal ALD using oxygen gas was carried out using Ti(O)(tmhd)$_2$ of formula (4) above as a precursor, the corresponding atomic layer was not deposited because the dicarbonyl group was virtually unaffected and rarely decomposed.

As to the atomic layers prepared in Examples 7 and 8, the alkoxy group was easily oxidized, but the dicarbonyl group was oxidized at a high temperature above 450° C., like the "tmhd" ligands.

As described above, the ALD method according to the present invention using reactive oxygen radicals can use organometallic complexes with β-diketone ligands, which could not be used in the conventional thermal ALD method using oxygen or water as an oxidizing agent. In addition, the problem of the removal of organic substances in using organometallic complexes with β-diketone ligands can be solved by oxygen radicals generated using plasma in the ALD method according to the present invention. Therefore, the present invention enables diversification of the precursors for ALD and formation of excellent oxide films at low temperatures.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An atomic layer deposition (ALD) method comprising chemically adsorbing an organometallic complex with a β-diketone ligand onto a substrate and oxidizing the chemically adsorbed organometallic complex using activated oxygen radicals to deposit an atomic metal oxide layer on the substrate.

2. The method as claimed in claim 1, wherein the activated oxygen radicals are generated by reacting plasma as an energy source with at least one oxygen-containing gas selected from the group consisting of oxygen, ozone, nitrogen monoxide, and water vapor.

3. The method as claimed in claim 2, wherein the at least one oxygen containing gas is irradiated with ultraviolet (UV) light during reaction with the plasma to generate the activated oxygen radicals.

4. The method as claimed in claim 1, wherein the organometallic complex with a β-diketone ligand has formula (1) below:

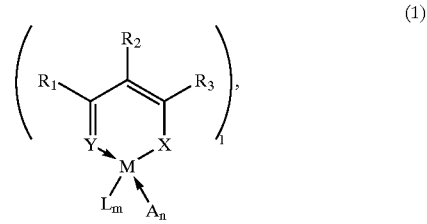

(1)

wherein is a metal ion with a valence number of 1 to 6; X is O, NH, or S; Y is O, N, or S; and R$_1$, R$_2$, and R$_3$ are independently a hydrogen atom, a linear or branched unsubstituted alkyl group having 2 to 10 carbon atoms, a linear or branched alkoxy group-substituted alkyl group having 2 to 10 carbon atoms, a linear or branched alkoxyalkyleneoxy group-substituted alkyl group having 2 to 10 carbon atoms, or an alkylamine group having 2 to 10 carbon atoms; I is 1 or 2; L is an anionic ligand coordinated to metal M; m is an integer from 0 to 5; A is a neutral ligand; and n is an integer from 0 to 4.

5. The method as claimed in claim 4, wherein; in formula (1), L is an alkoxy group having 1 to 10 carbon atoms, an alkyl group having 1 to 5 carbon atoms or an alkylamine or alkylsulfide group having 1 to 10 carbon atoms, and A is oligoether or amine.

6. The method as claimed in claim 1, wherein the organometallic complex with a β-diketone ligand is selected from the group consisting of compounds having formulae (2) through (13) below:

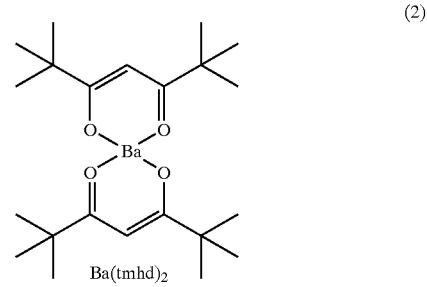

(2)

Ba(tmhd)$_2$

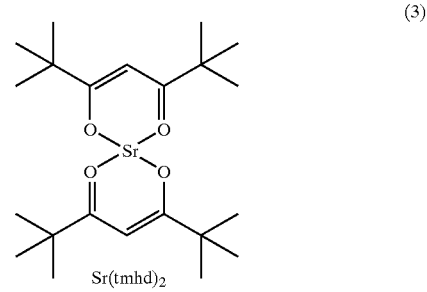

(3)

Sr(tmhd)$_2$ (4)
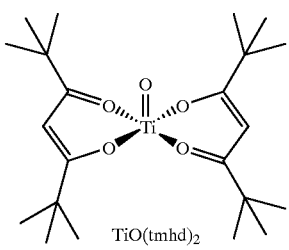
TiO(tmhd)₂
(5)
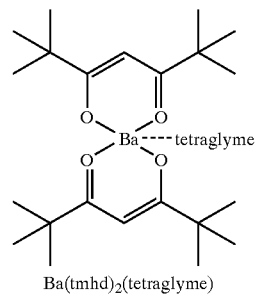
Ba(tmhd)₂(tetraglyme)
(6)
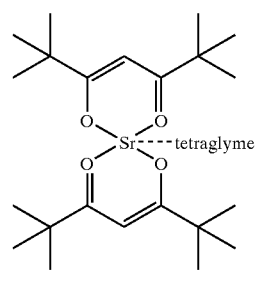
Sr(tmhd)₂(tetraglyme)
(7)
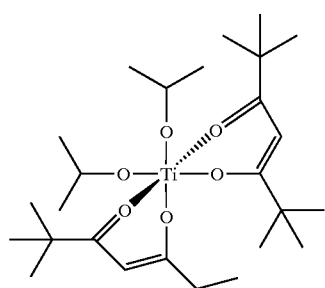
Ti(i-Opr)₂(tmhd)₂
(8)
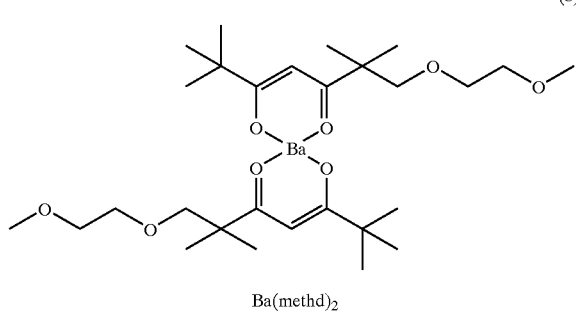
Ba(methd)₂
(9)
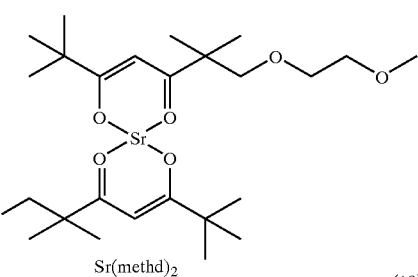
Sr(methd)₂
(10)
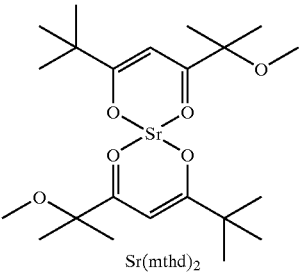
Sr(mthd)₂
(11)
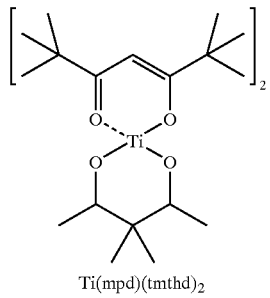
Ti(mpd)(tmthd)₂
(12)
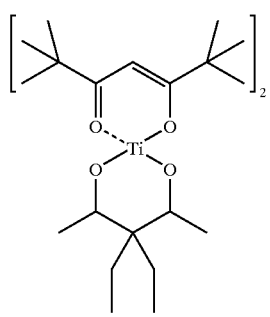
Ti(depd)(tmthd)₂
(13)
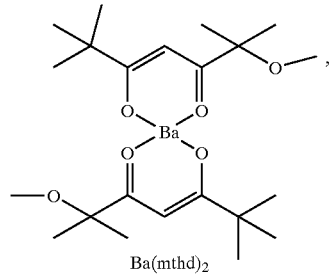
Ba(mthd)₂
where,
i-OPr stand for isopropyl
mthd stands for methoxytetraethylheptanedionate
metmhd stands for methoxyethoxytetramethylheptanedionate
dmpd stands for dimethylpentadiol, and
depd stands for diethylpentadiol.
* * * * *